United States Patent
Jorgensen et al.

(10) Patent No.: US 7,330,808 B1
(45) Date of Patent: Feb. 12, 2008

(54) DUMMY BLOCK REPLACEMENT FOR LOGIC SIMULATION

(75) Inventors: Vincent J. Jorgensen, Mountain View, CA (US); Walter N. Sze, Los Altos Hills, CA (US)

(73) Assignee: Xilinx, Inc., San Jose, CA (US)

( * ) Notice: Subject to any disclaimer, the term of this patent is extended or adjusted under 35 U.S.C. 154(b) by 669 days.

(21) Appl. No.: 10/627,335

(22) Filed: Jul. 24, 2003

(51) Int. Cl.
*G06F 17/50* (2006.01)

(52) U.S. Cl. .......................................... 703/14; 716/12

(58) Field of Classification Search ............ 703/13–14; 716/8, 9–17
See application file for complete search history.

(56) References Cited

U.S. PATENT DOCUMENTS

| | | | | |
|---|---|---|---|---|
| 4,613,941 A * | 9/1986 | Smith et al. | ............... | 716/12 |
| 5,128,871 A * | 7/1992 | Schmitz | ............... | 716/17 |
| 5,574,893 A * | 11/1996 | Southgate et al. | ............... | 703/17 |
| 5,638,291 A * | 6/1997 | Li et al. | ............... | 716/18 |
| 5,644,498 A * | 7/1997 | Joly et al. | ............... | 716/2 |
| 5,761,077 A * | 6/1998 | Shackleford | ............... | 716/7 |
| 6,173,434 B1 * | 1/2001 | Wirthlin et al. | ............... | 716/17 |
| 6,345,378 B1 * | 2/2002 | Joly et al. | ............... | 716/2 |
| 6,374,205 B1 * | 4/2002 | Kuribayashi et al. | ............... | 703/14 |
| 6,434,734 B1 * | 8/2002 | Zahar | ............... | 716/12 |
| 6,516,457 B1 * | 2/2003 | Kondou | ............... | 716/8 |
| 6,567,967 B2 * | 5/2003 | Greidinger et al. | ............... | 716/10 |
| 6,606,737 B1 * | 8/2003 | Zahar | ............... | 716/12 |
| 6,687,892 B1 * | 2/2004 | Zahar | ............... | 716/12 |
| 6,857,110 B1 * | 2/2005 | Rupp et al. | ............... | 716/4 |
| 6,865,721 B1 * | 3/2005 | Dahl et al. | ............... | 716/2 |
| 6,895,524 B2 * | 5/2005 | Korobkov | ............... | 713/500 |
| 6,957,412 B1 * | 10/2005 | Betz et al. | ............... | 716/16 |
| 6,968,487 B1 * | 11/2005 | Bryant et al. | ............... | 714/726 |
| 2001/0011362 A1 * | 8/2001 | Yoshinaga | ............... | 716/8 |
| 2002/0007261 A1 * | 1/2002 | Ochi et al. | ............... | 703/14 |

OTHER PUBLICATIONS

Huang et al. Proceedings of the 1997 international symposium on Physical design, Partitioning-based standard-cell global placement with an exact objective. pp. 18-25.*

* cited by examiner

*Primary Examiner*—Paul Rodriguez
*Assistant Examiner*—Eunhee Kim
(74) *Attorney, Agent, or Firm*—Pablo Meles; Kevin T. Cuenot

(57) ABSTRACT

A method (10) of reducing a size of a netlist for a target architecture can include the steps of creating (12) a netlist of objects for the target architecture, identifying (14) objects specific to the target architecture that are repeated regularly to identify potential dummy objects, creating (15) a list of objects used by a design in the target architecture, and forming (16) a list of unused objects in the target architecture from the netlist of objects and the list of objects used by the design. The method can further include the steps of replacing (18) at least one object in the list of unused objects with an appropriate dummy object to form a modified netlist and simulating (19) the modified netlist.

17 Claims, 4 Drawing Sheets

DUMMY BLOCK REPLACEMENT FOR LOGIC SIMULATION

BACKGROUND OF THE INVENTION

1. Technical Field

The present invention relates to the field of logic simulation and, more particularly, to reducing the size of a netlist during simulation.

2. Description of the Related Art

A logic simulator is a software tool, which is capable of performing functional and timing simulations for digital electronic designs which are written in a hardware description language (HDL) such as VHSIC Hardware Description Language (VHDL) or Verilog. The VHSIC acronym stands for Very High Speed Integrated Circuits. VHDL and Verilog are HDLs used to design and document electronic systems. Verilog, for example, permits hardware designers to define signals at a very high level of abstraction. The abstracted signal representations can be translated to actual pins on a microchip using any of a variety of commercial electronic design automation (EDA) software tools. Verilog and VHDL are both object-oriented languages and thus have the equivalent of classes or design units and instances or objects. An object or an instance is an instantiation of a class. In Verilog, classes are called "modules" and an instance can be an instantiation of the module. Both Verilog and VHDL are typed languages, meaning that declaration statements are used to make known the types of the objects. A module is declared and then instantiated to yield a module instance. It should be noted that a second module declaration cannot be nested within a first module declaration in Verilog, but instances of a second module can be nested within a first module.

Verilog (and VHDL) have the language feature that when the functional description contained in the module in Verilog (and in the architecture of the entity/architecture pair in VHDL), i.e., y=f(x), where x is the input port and y the output port, is missing (or deleted), the signals are "fed-through" unchanged. For example, in the case where module IA is connected to module IE and module IB is connected to module IC (where "I" indicates an instance of a module), then if IB is an instance of a module without any functional mapping, i.e., empty, then IB serves as a connection point between IA and IC, like a signal wire.

As the size of field programmable gate arrays (FPGAs) and other devices become inordinately larger, the size of netlists describing such devices have correspondingly grown. In turn, the time and cost of simulating and verifying such devices using such large netlists have also increased. With respect to simulation of FPGAs, several techniques have been used in an attempt to overcome problems encountered with simulation using such large netlists. Small array sizes are used where possible. Alternatively, increased memory on the servers can be utilized and finally faster servers can be used. Smaller array sizes are effective for bringing a new family of parts up to speed with verification, but ineffective when larger members of the family are desired to be verified. Increased memory has helped for a time, but array sizes (and therefore the transistor count) kept increasing on components that required overall verification or simulation. Faster servers only help to an extent, but memory and the lack thereof still present inadequacies in simulation and verification solutions for today's significantly larger architectures.

In consequence, the amount of time required to simulate and verify large field programmable gate arrays and other devices represented by netlists using current software simulation tools can be significant as the sheer number of calculations necessary can be quite extensive. What is needed is an improved technique for reducing the time and resources required for simulation, verification and other processing of hardware described using hardware description language which in turn translates into utilization of fewer processing resources, less simulation time, and therefore reduced time required for design and implementation of such hardware.

SUMMARY OF THE INVENTION

Exemplary embodiments in accordance with the present invention provide a method, system, and apparatus for reducing netlist sizes using a technique termed herein as Dummy Block Replacement (DBR). More particularly, such embodiments realize significant performance benefits with respect to processing in the context of software logic simulation. Such embodiments disclose techniques teaching an alternative to presently available techniques that reduce the time needed for similar processing functions.

In one embodiment of the present invention, a method of reducing a size of a netlist for a target architecture can include the steps of creating a netlist of objects for the target architecture, identifying objects specific to the target architecture that are repeated regularly to identify potential dummy objects, creating a list of objects used by a predetermined design in the target architecture, and forming a list of unused objects in the target architecture from the netlist of objects and the list of objects used by the predetermined design. The method can further include the steps of replacing at least one object in the list of unused objects with an appropriate dummy object to form a modified netlist and simulating the modified netlist.

In another embodiment, a method of reducing a size of processing signals with a modified netlist within a software-based logic simulation tool can include the steps of composing a list of repeated objects specific to a target architecture that are repeated objects, emptying the repeated object found on the list of repeated objects forming a plurality of dummy objects, parsing a file to extract a list containing object names for all used objects for the target architecture, and parsing a netlist of objects line by line for the target architecture. The method can further include the steps of replacing any object in the netlist with a corresponding dummy object from the plurality of dummy objects, if the object in the netlist is not on the list containing object names for all used instances, to form the modified netlist, and simulating the modified netlist.

Another aspect of the present invention can include an embodiment in the form of system or a machine readable storage, having a computer program having a plurality of code sections executable by a machine for causing the machine or system to perform the steps described in the methods above.

BRIEF DESCRIPTION OF THE DRAWINGS

There are shown in the drawings embodiments which are presently preferred, it being understood, however, that the invention is not so limited to the precise arrangements and instrumentalities shown.

DETAILED DESCRIPTION OF THE INVENTION

Embodiments in accordance with the present invention provide a method, system, and apparatus for processing signals with a modified netlist and reducing netlist sizes using DBR. DBR is particularly useful when attempting to simulate hardware holistically where the netlist corresponding to the entire hardware system is inordinately large. DBR can certainly be equally as useful when the component parts of a target hardware architecture under simulation also has a large corresponding netlist. Using DBR as embodied in accordance with one aspect of the present invention, all instances or objects of pertinent or redundant blocks (for an FPGA design, for example) are found and collated from known information about a test design for a target architecture. DBR can then essentially selectively "remove" unused blocks (or objects) from an original netlist. In the context of Verilog, the act of "removing", "emptying" or "replacing" an object or instance should be understood herein as creating an instance of a module without any functional mapping or that is empty. By selectively "removing" unused blocks and running a design using a condensed or modified netlist, the throughput for design verification significantly increases particularly on larger arrays having many regularly repeated blocks (or objects) that are logic intensive. For example, the regularity of an FPGA architecture includes a basic block fitting this category. The basic block (called a CLB for Configurable Logic Block) is typically made up of three Function Generators. The CLB can implement functions of a number of variables with this arrangement. In this light, embodiments of the present invention should distinguishable from and not be confused with a stub. A stub, which is also called a dummy routine, is a routine that contains no executable code and that generally consists of comments describing what will eventually be there. It is used as a placeholder for a routine to be written later. A stub is not an element that would be simulated whereas the dummy object as used in the embodiments of the present invention must be simulated and cannot be removed.

Figure 1:
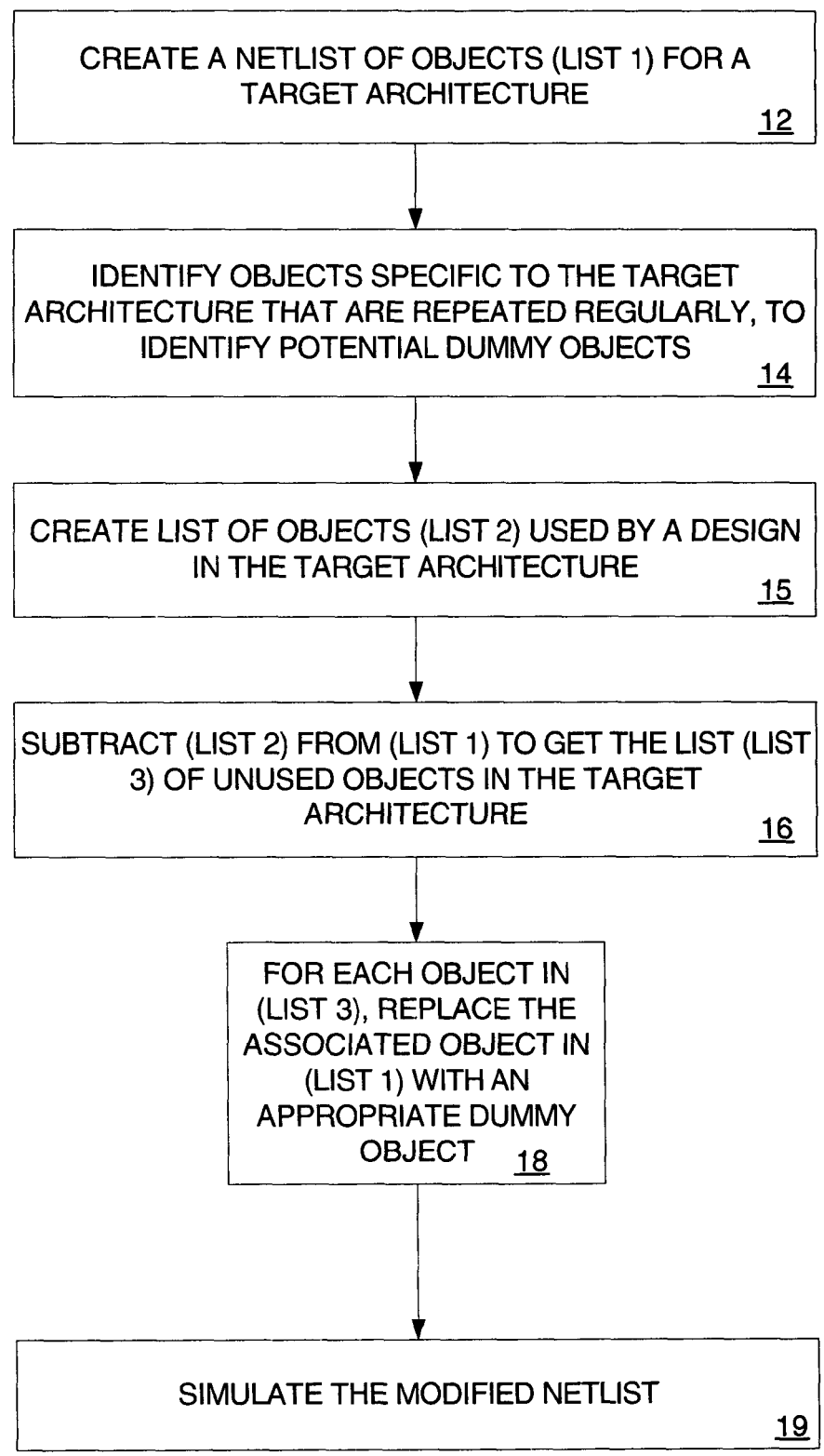
FIG. 1 is a flow chart of a dummy block replacement method in accordance with the present invention.

Referring to FIG. 1, a flow chart illustrating a dummy block replacement method 10 for ultimately reducing a size of a netlist and enabling quicker and improved logic simulation. The method 10 can include the steps of creating a netlist of objects (List 1) for a target architecture at step 12 and creating a list of objects (List 2) used by a predetermined design, e.g., a design for a user application, in the target architecture at step 15. Additionally at step 14, objects specific to the target architecture that are repeated regularly should be identified to identify potential dummy objects. A list of unused objects (List 3) in the target architecture, e.g., objects not used by the user design, can be formed at step 16 by subtracting List 2 from List 1. For each object in List 3, the associated object in the netlist of objects (List 1) can be replaced with an appropriate dummy object at step 18. The appropriate dummy object can be selected from the potential dummy objects identified in step 14. Step 18 results in the creation of a modified netlist. Finally, at step 19, the modified netlist having at least one dummy object therein is simulated.

The following example further illustrates an embodiment of the present invention. Given an array of objects, array [Ia1, Ia2, Ia3 . . . ] in the case where all elements in the array will be used, i.e., each element has a statement where it is on the left-hand side (LHS), such as Ia1=5, (and hence simulated).

Also given there is a subset of array elements which are never on the right hand side (RHS), e.g., Ia1 is never used in for example Ia2=Ia1+1. In existing optimization routines (normally done by a compiler), these LHS only terms (i.e., never used terms) are stripped out (or commented out). Thus, existing systems remove elements in the array in contrast to some embodiments of the present invention, where in the case of modeling an FPGA, for example, all the terms (i.e., all the elements in the array) must be simulated and cannot be removed. The solution is to create dummy objects that can be simulated. Although signals are fed through unchanged during simulation, these elements nonetheless remain during simulation in contrast to existing non-analogous systems that strip the unused elements out.

Hence in the case where all elements in an object must be simulated, an optimization technique to replace those never used objects (i.e., in the scenario of an FPGA design simulation, those objects in an FPGA target architecture not used by a customer's particular design) with dummy objects. As a practical refinement, in one embodiment, only objects that are repeated frequently are replaced with dummy objects, rather than ideally every non-used object.

Figure 2:
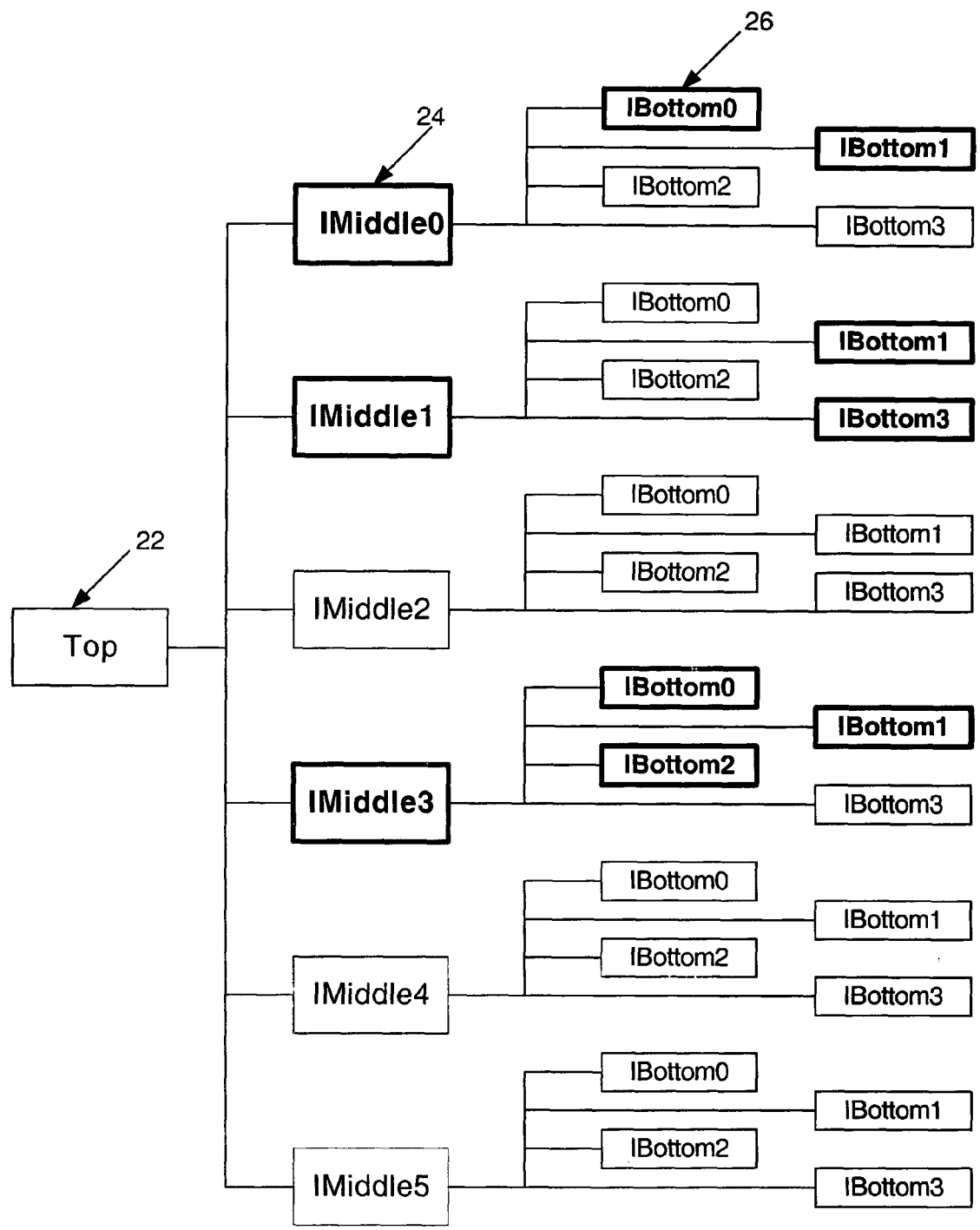
FIG. 2 is an exemplary netlist describing a target architecture.

Referring to FIGS. 1 and 2, the following pseudo code Verilog example is used to further illustrate embodiments of the present invention. Some details have been omitted so as not to obscure some of the inventive concepts in this particular example. The Verilog module, i.e., object, hierarchical structure 20 for the example is shown in FIG. 2. The "root" module is given by the "top" module 22. The next level under the top module is the "middle" module 24 of which six middle modules instances (or objects), e.g., Imiddle0, Imiddle1, Imiddle2, Imiddle3, Imiddle4, and Imiddle5, are shown. The middle module type can be a CLB (or block random access memories—BRAMs) in an FPGA architecture. Each middle module can have four bottom modules instances, i.e., Ibottom0, Ibottom1, Ibottom2, and Ibottom3, which may represent, for example, function generators. In FIG. 2 the bold blocks illustrate the module instances used by the predetermined user design, as given by an example of the force file given below. Hence, Imiddle0, Imiddle1 and Imiddle3 are used, and Imiddle2, Imiddle4, and Imiddle5 are not used (but will be simulated).

Figure 3:
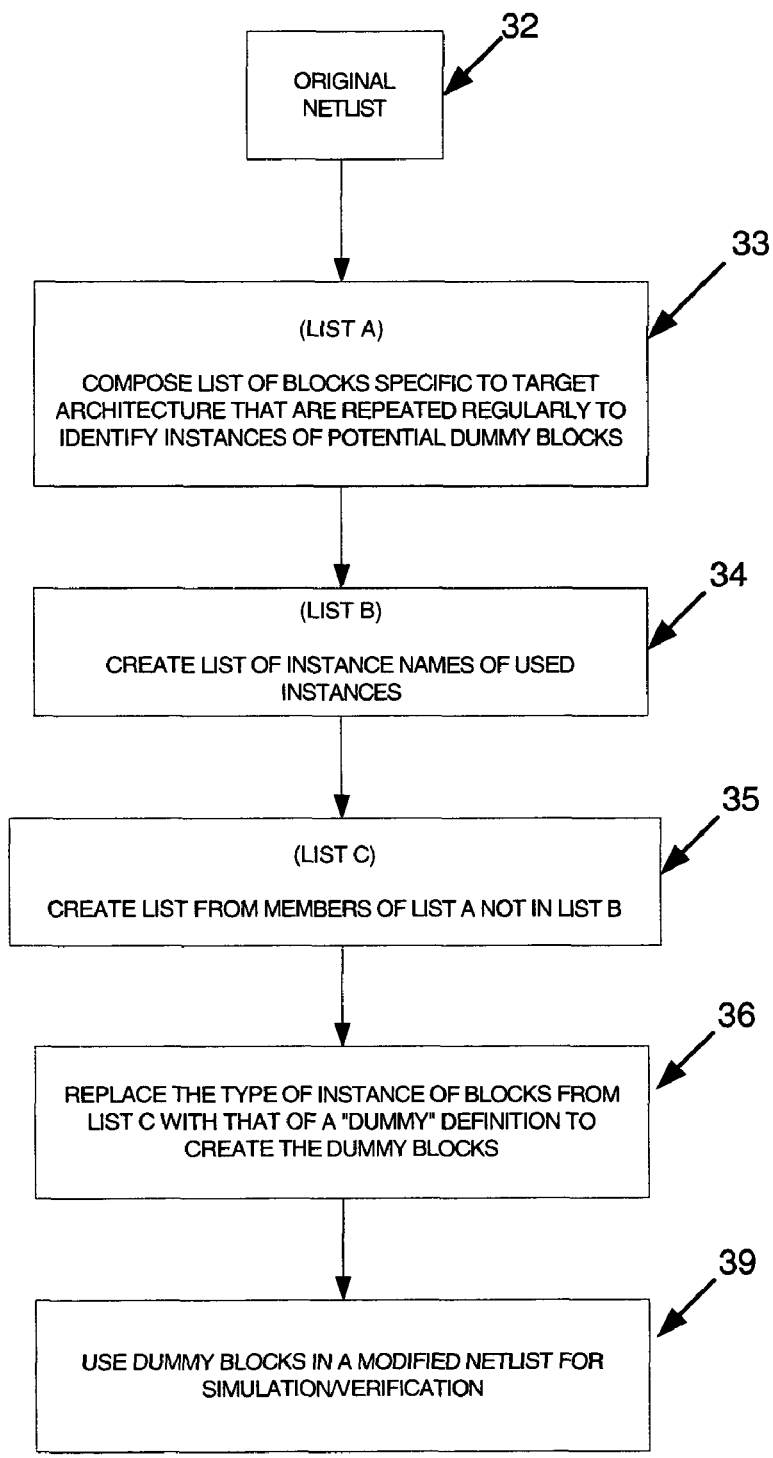
FIG. 3 is a flow chart illustrating a method of reducing a netlist in accordance with the inventive arrangements disclosed herein.

Here is an example Verilog pseudo code for a netlist as found in FIG. 2 (where "//" indicates code comments):

```
module top;
//nets, ports, variables go here.
    middle Imiddle0 (//list of ports go here);
    middle Imiddle1 (//list of ports go here);
    middle Imiddle2 (//list of ports go here);
    middle Imiddle3 (//list of ports go here);
    middle Imiddle4 (//list of ports go here);
    middle Imiddle5 (//list of ports go here);
...
endmodule
module middle (//list of ports go here);
//port declarations, e.g., x in, y out go here
//module definition (function that maps input
//ports x to output ports y, i.e., y=f(x):
    bottom Ibottom0 (//list of ports go here);
    bottom Ibottom1 (//list of ports go here);
    bottom Ibottom2 (//list of ports go here);
``` bottom Ibottom3 (//list of ports go here);
//bottom module connections go here
. . .
endmodule Pseudo code for a dummy object or module is:
module middle_dummy (//list of ports go here);
//ports declarations, e.g., x in, y out go here
//there is NO module definition; this has been emptied out or removed
endmodule;

A sample force file (list of used objects), using our example, can look like:
force Itop.Imiddle0.Ibottom0.signal=1;
force Itop.Imiddle0.Ibottom1.signal=1;
force Itop.Imiddle1.Ibottom1.signal=1;
force Itop.Imiddle1.Ibottom3.signal=1;
force Itop.Imiddle3.Ibottom0.signal=1;
force Itop.Imiddle3.Ibottom1.signal=1;
force Itop.Imiddle3.Ibottom2.signal=1;

Below is a modified netlist (lower modules not shown) having dummy blocks or objects replacing the unused objects:
module top;
//nets, ports, variables go here.
    middle Imiddle0 (//list of ports go here);
    middle Imiddle1 (//list of ports go here);
    middle_dummy Imiddle2 (//list of ports go here);
    middle Imiddle3 (//list of ports go here);
    middle_dummy Imiddle4 (//list of ports go here);
    middle_dummy Imiddle5 (//list of ports go here);
. . .
endmodule Referring to FIG. 3, a flow chart illustrating a method 30 of reducing a size of a netlist 32 for a target architecture is shown. The method can include at block 33 the step of composing a list of blocks specific to the target architecture that are repeated blocks. The list can ideally include a list of "root" or "top" modules or blocks specific to the target architecture being implemented that are repeated regularly although the present invention is not limited to such top modules. The list from block 33 (List A) will eventually be used to identify instances of potential dummy objects or dummy blocks. List A can be manually composed with a list of top modules or blocks specific to the target architecture. The top blocks can be logic-intensive blocks that are repeated regularly and any given design will only use a few instances of these types of blocks. The regularity of a Xilinx FPGA architecture in particular allows List A to be comprised of mostly top-level blocks such as a CLB blocks. The hardware description language version (whether Verilog or other HDL) copy of the potential dummy blocks will be created and emptied of content or functionality so that they can perform feed-through capabilities. Once a block is devoid of logic, they become "dummy blocks" or "dummy objects". So, emptying the repeated blocks found on the list of top blocks forms a plurality of dummy blocks. The steps above only need to be performed once per family. The steps described below can occur for each design where the DBR methodology is desired.

Next, the method parses a file to extract a list (List B) containing block or object names for all used objects for the target architecture at block 34. In one embodiment, a computer program parses a "force.v" file and extracts block or object names. This list, once complete, contains all the names of all used objects for the particular target design. The "force.v" file is a file consisting of hierarchical path names to the memory blocks of an FPGA. This file is design specific and exists as part of the simulation process and is generated by converting bitstream names into Verilog hierarchical path names. Memory blocks, which are un-used in the design, are not included in the file. Thus, the negation (as shown at block 35) of the "used" blocks (List B) forms a list of unused blocks (List C) that are masked out in the modified netlist or reconfigured Verilog netlist. At block 36, the method 30 replaces any object found in the repeated list of objects (List C) with a corresponding dummy object from the plurality of dummy object if the object found in the repeated list is not on the list containing object names for all used objects. The method 30 can further include the step of parsing the netlist for the target architecture line by line and forming a modified netlist with the plurality of dummy objects (when all lines of the netlist have been parsed) and subsequently simulating with the modified netlist at block 39.

Figure 4:
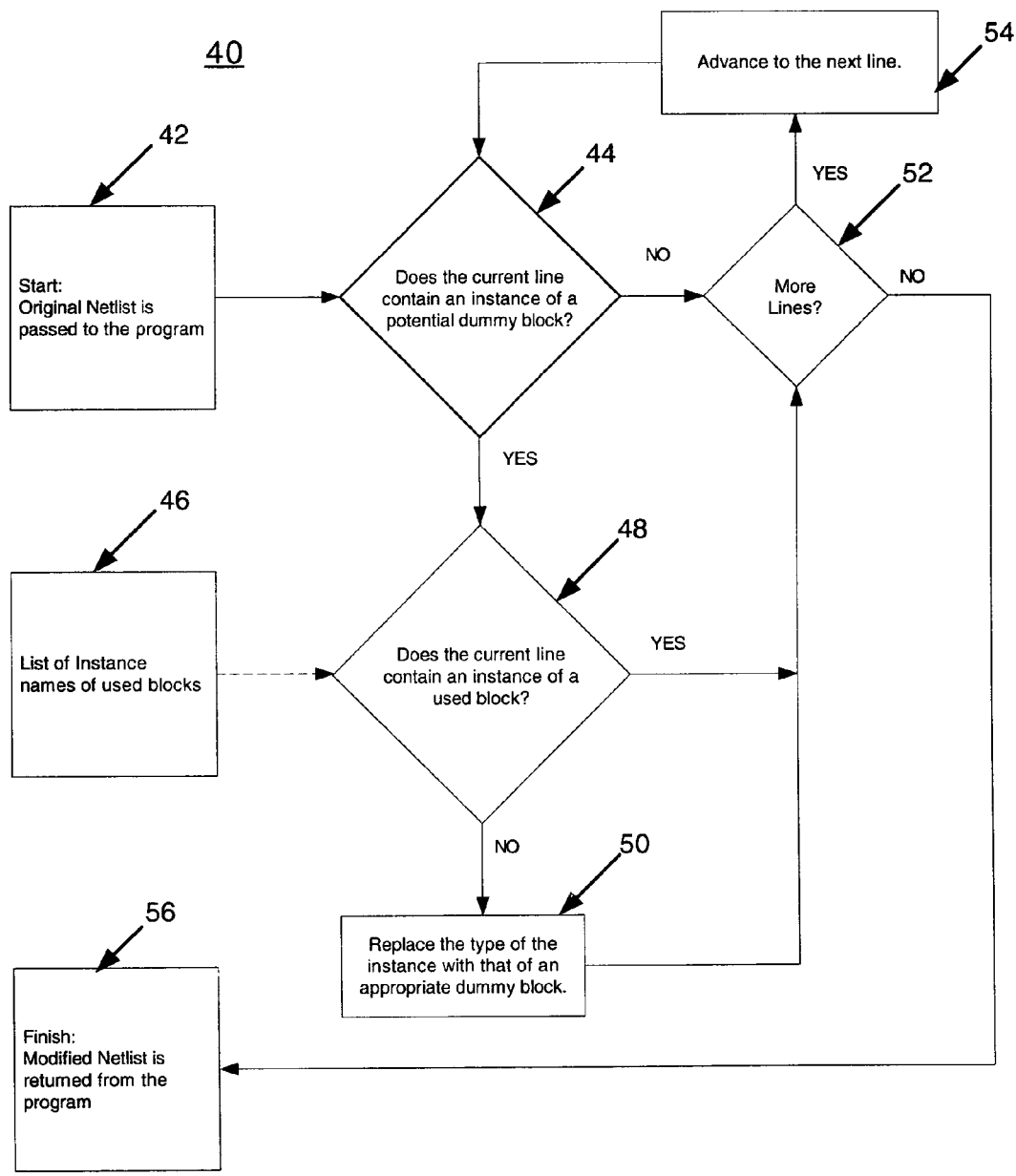
FIG. 4 is flow chart illustrating another method of reducing a netlist in accordance with the inventive arrangements disclosed herein.

Referring to FIG. 4, a flow chart illustrating a method 40 of processing signals with a modified netlist within a software-based logic simulation tool is shown. In one sense, method 40 of FIG. 4 illustrates a more detailed process of blocks 34 and 35 of FIG. 3. The method 40 passes the original netlist for a specific target architecture to the DBR program at step 42. At decision block 14, it is determined if the current line contains an instance of a potential dummy object or block. As discussed above with regard to block 33 of FIG. 3, the potential dummy objects are composed from a list of repeated top blocks specific to a target architecture that are repeated blocks. If the current line does not contain an instance of the potential dummy block, then at decision block 52 it is determined if there are additional lines to assess under the DBR program. If there are no more lines, then the modified netlist is completed at block 56. If there are additional lines, then the method 40 is advanced to the next line at block 54 before returning to decision block 44.

If the current line contains an instance of a potential dummy block at decision block 44, then decision block 48 determines if the current line contains an instance of a used block or a used object. Decision block 48 can use a list of object (or instance) names of used blocks 46 (similar to the list resulting from block 34 of FIG. 3) to determine whether a used object name exists on the current line. If the current line contains a used object at decision block 48, then the method 40 goes to decision block 52 to determine if additional lines need analysis. If the current line does not contain the object name of a used block, then the type of the instance on the current line is replaced with a "dummy" definition at block 50. In other words, an a dummy object replaces an unused object. The method 40 continues parsing the netlist line by line until no additional lines exist and a modified netlist is formed and returned for subsequent use in simulation and verification at block 56. Method 40 essentially parses the netlist line by line for the target architecture and replaces any instance declaration in the netlist of a block found in the repeated list (of top or other as desired) blocks with an instance declaration of a corresponding dummy block from the plurality of dummy blocks if the block found in the list of repeated blocks is not on the list containing block names for all used instances to form the modified netlist. The method 40 then "feeds-through" the plurality of dummy blocks or dummy objects (as part of the modified netlist during a simulation process using the modified netlist.

An embodiment of the present invention can be realized in hardware, software, or a combination of hardware and software. The embodiment can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

An embodiment of the present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of reducing a size of a netlist for a hardware target architecture for simulation, comprising:
   create a netlist of objects specifying each object for the target hardware architecture, wherein the target hardware architecture is a field programmable gate array;
   identify objects specific to the target hardware architecture that are repeated to identify potential dummy objects;
   create a list of objects, from the netlist of objects, that are used by a circuit design to be implemented in the target hardware architecture;
   form a list of unused objects in the target hardware architecture from the netlist of objects and the list of objects used by the circuit design;
   replace at least one object in the netlist of objects for the target hardware architecture that is also specified in the list of unused objects and which is identified as a potential dummy object with an appropriate dummy object to form a modified netlist by removing functional hardware description language from the object; and
   simulate the modified netlist by simulating each object of the modified netlist inclusive of each dummy object, wherein for each dummy object, a signal provided to the dummy object is fed through the dummy object unchanged.

2. The method of claim 1, wherein the step of forming the list of unused objects comprises the steps of subtracting the list of objects used by the circuit design from the netlist of objects.

3. The method of claim 1, wherein the step of replacing at least one object comprises the step of replacing objects in the netlist of objects for the target hardware architecture that are also specified in the list of unused objects that are repeated with the appropriate dummy objects to form the modified netlist.

4. The method of claim 1, wherein the step of replacing at least one object comprises the step of replacing each object in the netlist of objects for the target hardware architecture that is also specified in the list of unused objects with the appropriate dummy object to form the modified netlist.

5. The method of claim 1, wherein the step of forming the list of unused objects comprises the steps of parsing a file to extract a list containing object names for all used instances for the target hardware architecture and parsing the netlist for the target architecture.

6. The method of claim 1, wherein the step of replacing comprises replacing a type of an instance for an object found in the repeated list of objects with a type for a corresponding dummy object if the object found in the repeated list is not on the list containing object names for used objects.

7. The method of claim 1, wherein the method further comprises the step of parsing the netlist for the target hardware architecture line by line and forming a modified netlist with the appropriate dummy objects when all lines of the netlist have been parsed.

8. The method of claim 7, wherein the method further comprises the step of feeding through a signal unchanged when simulating the appropriate dummy object during a simulation process using the modified netlist.

9. The method of claim 1, wherein the step of forming the list of unused objects comprises the step of manually composing a list of repeated root objects specific to the target hardware architecture.

10. The method of claim 1, wherein the step of replacing comprises the step of emptying a hardware description language version of a repeated object to form an object devoid of an explicit functional mapping of an input to an output.

11. A method of processing signals with a modified netlist within a software-based logic simulation tool comprising the step of:
   creating a netlist of objects specifying each object for a target hardware architecture, wherein the target hardware architecture is a field programmable gate array;
   identifying objects specific to the target hardware architecture that are repeated to identify potential dummy object;
   creating a list objects, from the netlist of objects, that are used by a circuit design to be implemented in the target hardware architecture;
   forming a list of unused objects in the target hardware architecture from the netlist of objects and the list of objects used by the circuit design;
   replacing any at least one object in the netlist of objects for the target hardware architecture that is also specified in the list of unused object and which is identified as a potential dummy object with an appropriate dummy object to form a modified netlist by removing functional hardware description language from the object; and
   simulating the modified netlist by simulating each object of the modified netlist inclusive of each dummy object, wherein for each dummy object, a signal provided to the dummy object is fed through the dummy object unchanged.

12. The method of claim 11, wherein the method further comprises feeding through a signal unchanged when simulating the modified netlist inclusive of each dummy object.

13. A machine readable storage, having stored thereon a computer program having a plurality of code sections executable by a machine for causing the machine to perform the steps of:
   create a netlist of objects specifying each object for a target hardware architecture, wherein the target hardware architecture is a field programmable gate array;

identify objects specific to the target hardware architecture that are repeated to identify potential dummy objects;

create a list of objects used by a circuit design to be implemented in the target hardware architecture;

form a list of unused objects in the target hardware architecture from the netlist of objects and the list of objects used by the circuit design;

replace at least one object in the netlist of the target hardware architecture that is also specified in the list of unused objects and which is identified as a potential dummy object with an appropriate dummy object to form a modified netlist by removing functional hardware description language from the object; and simulate the modified netlist by simulating each object of the modified netlist inclusive of each dummy object, wherein for each dummy object, a signal provided to the dummy object is fed through the dummy object unchanged.

14. The machine readable storage of claim 13, wherein the computer program further has a plurality of code sections executable by the machine for causing the machine to perform the step of parsing the netlist for the target hardware architecture line by line and forming a modified netlist with one or more of the appropriate dummy objects when all lines of the netlist have been parsed.

15. A system for simulating a circuit design for target hardware architectures for implementation on field programmable gate arrays comprising:

means for creating a netlist of objects specifying each object for the target hardware architecture, wherein the target hardware architecture is a field programmable gate array;

means for identifying objects specific to the target hardware architecture that are repeated to identify potential dummy objects;

means for creating a list of objects used by the circuit design in the target hardware architecture;

means for forming a list of unused objects in the target hardware architecture from the netlist of objects and the list of objects used by the circuit design;

means for replacing at least one object in the netlist of the target hardware architecture that is also specified in the list of unused objects and which is identified as a potential dummy object with an appropriate dummy object to form a modified netlist by removing functional hardware description language from the object; and means for simulating the modified netlist by simulating each object of the modified netlist inclusive of each dummy object, wherein for each dummy object, a signal provided to the dummy object is fed through the dummy object unchanged.

16. The system of claim 15, further comprising means for parsing the netlist for the target hardware architecture line by line and forming a modified netlist with a plurality of dummy objects when all lines of the netlist have been parsed.

17. The system of claim 15, wherein the system uses a Verilog version of a hardware description language.

* * * * *